United States Patent [19]
Jarry

[11] Patent Number: 4,749,659
[45] Date of Patent: Jun. 7, 1988

[54] METHOD OF MANUFACTURING AN INFRARED-SENSITIVE CHARGE COUPLED DEVICE

[75] Inventor: Philippe Jarry, Sucy-en-Brie, France

[73] Assignee: U.S. Philips Corp., New York, N.Y.

[21] Appl. No.: 20,065

[22] Filed: Feb. 27, 1987

Related U.S. Application Data

[62] Division of Ser. No. 671,150, Nov. 13, 1984, abandoned.

[30] Foreign Application Priority Data

Nov. 14, 1983 [FR] France ............................. 83 18028

[51] Int. Cl.$^4$ .......................................... H01L 21/208
[52] U.S. Cl. ........................................ 437/3; 437/24; 437/53; 437/130; 437/133; 357/30
[58] Field of Search ...................... 437/2, 53, 133, 24, 437/3; 357/24; 427/87

[56] References Cited

U.S. PATENT DOCUMENTS 4,257,057 3/1981 Cheung et al. ................. 357/24
4,273,596 6/1981 Gutierrez et al. ............... 437/53

OTHER PUBLICATIONS

Casey, H. C., Jr. et al. *Heterostructure Lasers*, pp. 15-17, 38-41, Acadamic Press, New York, (1978).
Liu, Y. Z. et al. "Observation of Charge Storage and Charge Transfer in a GaAlAsSb/GaSb Charge-Coupled Device," *Applied Physics Letters*, vol. 36, No. 6, pp. 458-461 (Mar. 15, 1980).
Quillec, M., et al. "High Mobility in Liquid Phase Epitaxial InGaAsP Free of Composition Modulations," *Applied Physics Letters*, vol. 42, No. 10, pp. 886-887 (May 15, 1983).

*Primary Examiner*—George T. Ozaki
*Attorney, Agent, or Firm*—Thomas A. Briody; Jack Haken

[57] ABSTRACT

A charge coupled device (CCD) sensitive to infrared radiation composed of a succession of three layers of Group III-V semiconductor material. The layers are a window layer, a sensitive layer and a storage layer. The layers are fixed to a supporting plate serving as input for the radiation and as a rear surface of the device. The front surface of the device supports a plurality of control electrodes and at least one output electrode.

The window layer and the storage layer of the CCD are made of a binary compound AB. The sensitive layer is made of an n-ary compound $(A,X,Y \ldots)_{III}(B,M,N \ldots)_V$ having a larger forbidden energy band and a smaller absorption limit wavelength than the window and storage layers.

The three layers of the device are formed by epitaxial growth on a substrate. The substrate is a layer of the binary compound AB coated with an epitaxial layer of the n-ary compound. The epitaxial substrate layer is a chemical blocking layer. The substrate and the chemical blocking layer are subsequently removed chemically.

13 Claims, 2 Drawing Sheets

METHOD OF MANUFACTURING AN INFRARED-SENSITIVE CHARGE COUPLED DEVICE

This is a division of application Ser. No. 671,150, filed Nov. 13, 1984, now abandoned.

BACKGROUND OF THE INVENTION

The invention relates to a charge coupled device (CCD) sensitive to infrared radiation in a range lying between the wavelengths $\lambda_0$ and $\lambda_1$. The CCD comprises a succession of three layers of a semiconductor material consisting of elements from Groups III and V of the periodic table of the elements. The layers have crystal lattice parameters which are extremely close to each other.

The first layer of the CCD is designated as the window. The window has a large forbidden energy band so that it does not significantly absorb radiation having wavelengths greater than $\lambda_0$. The second so-called absorbing layer has a narrower forbidden energy band so that it absorbs radiation having a wavelength up to $\lambda_1$. The third so-called storage layer has a large forbidden energy band (i.e. a small wavelength absorption limit). At least one electrode is in ohmic contact with the storage layer and forms the output O of the device. A plurality of control electrodes are also periodically arranged on the surface of the third (storage) layer so as to form a line or a matrix of photo-sensitive elements. The electrodes are insulated from each other and are sequentially polarized by the signals of one or several clock generators $H_1, H_2 \ldots H_n$.

The invention further relates to a method of manufacturing this device.

Such a CCD is described in an article by Y. Z. Liu et al entitled "Observation of charge storage and charge transfer in a GaAlAsSb/GaSb charge-coupled device", Applied Physics Letters, Vol. 36, No. 5, pages 458-461, Mar. 14, 1980.

This document discloses a device sensitive to infrared radiation in the range lying between 1.0 μm and 1.8 μm. Such a device is of importance for military terrestrial applications (for example for use in infrared imaging devices), and for submarine applications.

In the wavelength range of from 0.9 to 2 μm, ambient radiation is considerably stronger than in the wavelength range below 0.9 μm. Thus, from about 1 μm, the contribution of photons thermally radiated by an object to be detected is very substantial. This phenomenon permits very satisfactory imaging of such objects, if devices sensitive to these wavelengths are available.

The Liu et al article discloses a device having a window layer of GaAlAsSb. GaAlAsSb is a quaternary compound having a large forbidden energy band (i.e. an absorption limit on the order of 1 μm). The device has a sensitive layer of GaSb, a binary compound having a narrow energy band (i.e. and absorption limit on the order of 1.8 μm). Finally, the device has a storage layer of GaAlAsSb, a quaternary compound having a large forbidden energy band (i.e. a small absorption limit). The control electrodes form Schottky barriers with the storage layer.

A method of manufacturing this CCD starts with a GaSb substrate. The first, second and third layers are grown in the substance by epitaxy from the liquid phase. This assembly can be fused to a glass plate for mechanical support, for protection for the rear (window) layer, and for filtering small wavelengths.

Subsequently, the starting substrate of GaSb can be chemically removed, and the electrodes can be provided by conventional methods.

In this method, the starting GaSb substrate can be produced only with great difficulty. The substrates obtained by known techniques contain numerous dislocations. It is clear that the epitaxial layers formed on such substrates also contain large numbers of dislocations.

Moreover, the GaSb substrates obtained have very small diameters. They are not suitable for obtaining a large number of CCD's on the same wafer or even for obtaining CCD's of large surface areas. This is a great disadvantage of the method with respect to the short term industrial future.

Furthermore, since the demixing range of the compound is very large, the quaternary layer of (Ga,Al)- (As,Sb) can be processed only with very great difficulty.

Moreover, the use of a quaternary layer as a storage layer makes manufacturing the various electrodes very difficult. Therefore, the control electrodes must be electrodes which form Schottky barriers. The ohmic contacts are also difficult to obtain. Finally, it is necessary to form a supplementary ohmic contact for the guard anode. The guard anode is a gate which is polarized so that it depletes the n-type storage layer between the control electrodes.

Finally, this device must be cooled to 77° K. so as to reduce the dark current.

However, the most serious disadvantage is that no synergy at all exists between the manufacture of such a CCD and the manufacture of integrated circuits to be used with the CCD. This is certainly a problem as to the industrial development of this novel technology because it is very expensive to utilize a difficult technology to obtain only a small number of devices. However, this is an even larger problem for the manufacture of the CCD itself.

In fact, it is necessary to add peripheral circuits, such as an output amplifier and a clock signal generator, which are ultrahigh speed or superhigh frequency devices, to the CCD. It is desirable to be able to integrate these circuits monolithically on the same substrate as the CCD so as to increase the speed and the reliability of the assembly, while reducing its manufacturing cost and the technological difficulties in the manufacture of the CCD. This proves to be impossible by means of the technology described by Liu et al.

SUMMARY OF THE INVENTION

The present invention overcomes these disadvantages by providing a novel charge coupled device (CCD) in which, firstly, the window layer and the storage layer are formed from a binary compound AB. A is an element from group III and B is an element from group V. This binary compound is chosen to have a large forbidden energy band and the desired absorption limit of $\lambda_0$. Secondly, the sensitive layer is formed from an n-ary compound $(A,X,Y, \ldots)_{III}(B,M,N, \ldots)_V$. The elements A, X, Y . . . are from group III. The elements B, M, N . . . are from group V. The concentrations of the elements are chosen so that the crystal lattice parameter of the n-ary compound is adapted to that of the binary compounds, and so that the n-ary compound has a narrow forbidden energy band (i.e. the desired large absorption limit $\lambda_1$). The n-ary compound also does not fall within the demixing range of the n-ary solid solution, and moreover has a direct forbidden band transition.

An advantage of such a device resides in the fact that the active layer is a binary layer compatible with $A_{III}B_V$ integrated circuits.

According to a variation of this device, the absorbing layer is a quaternary compound having the formula $C_xA_{1-x}D_yB_{1-y}$, where C is an element of group III and D is an element of group V.

According to a preferred embodiment, the binary layer is made of InP having an absorption limit $\lambda_0=0.9$ μm. The quaternary layer is $Ga_xIn_{1-x}As_yP_{1-y}$, where $x=0.47$ and $y \leq 0.1$, having an absorption limit $\lambda_1=1.7$ μm.

An advantage of the latter CCD is that it is very satisfactorily adapted to the envisaged applications of infrared imaging devices.

A method of manufacturing a device according to the invention begins with forming a monocrystalline substrate from an ingot of the binary semiconductor compound AB. Then, the following layers are successively formed on this substrate by epitaxial growth:

(a) a chemical blocking layer of the n-ary compound $(A,X,Y, \ldots)_{III}(B,M,N, \ldots)_V$, (b) the storage layer of the binary n-doped compound AB, (c) the absorbing p-doped layer of the n-ary compound, (d) the window layer of the binary compound AB.

After the layers are deposited, the outer surface of the window layer is fused to the supporting plate. The substrate and the chemical blocking layer are then successively removed by selective chemical attacks, and the electrode contacts are formed at the surface of the storage layer.

DESCRIPTION OF THE PREFERRED EMBODIMENTS

Figure 1:
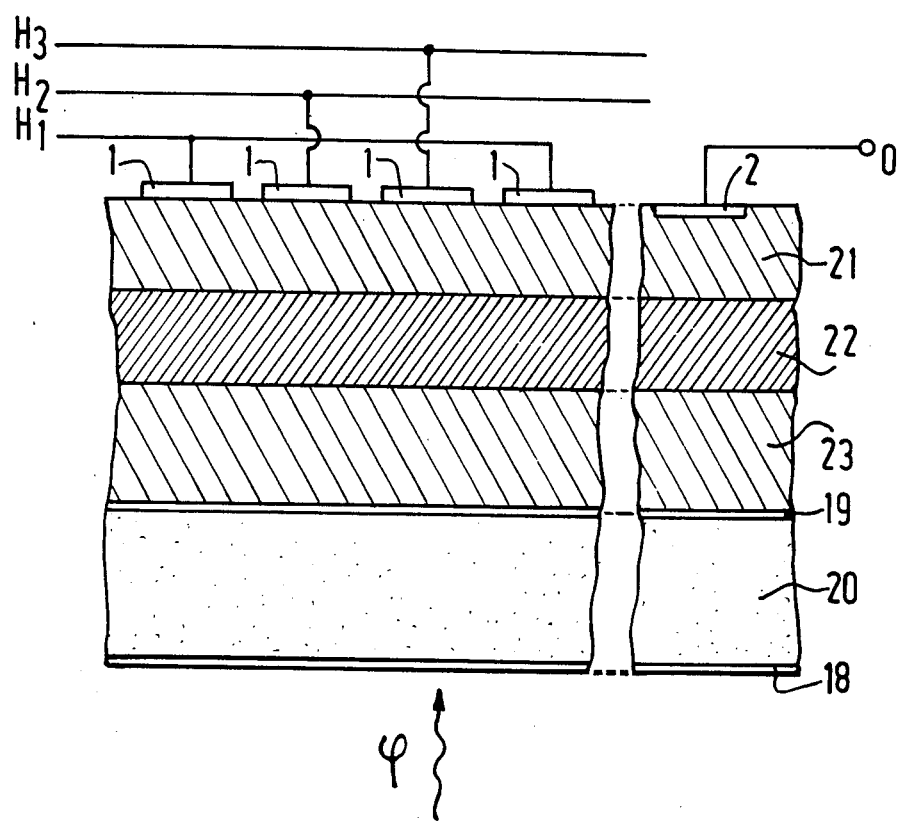
FIG. 1 is a partly schematic, partly sectional view of a CCD according to the invention.

The Figures are schematic and to scale, but for the sake of clarity the dimensions, especially the thicknesses, are strongly exaggerated. Semiconductor zones of the same conductivity type are cross-hatched in the same direction. Also, in the different Figures corresponding parts are designated by the same reference numerals.

As shown in FIG. 1, the infrared-sensitive CCD according to the invention first comprises a supporting plate 20. On either side of plate 20 are antireflection layers 18 and 19.

The supporting plate 20 supports the three layers of different semiconductor materials constituting the CCD. The first layer is the window layer 23. It is formed from a binary compound AB, where A is an element of group III and B is an element of group V of the periodic table of the elements. This compound is a group III-V semiconductor having a large forbidden energy band (i.e. a small wavelength absorption limit $\lambda_0$). This layer absorbs radiation of small wavelength, which improves contrast, and it reduces the recombination at the surface of the next layer.

The second layer is a p-doped absorbing layer 22. It is formed from a quaternary material $C_xA_{1-x}D_yB_{1-y}$, where C and D are elements of group III and of group V, respectively. Layer 22 has a narrow forbidden energy band, a large absorption coefficient, and a short diffusion length, so as to obtain a high spatial resolution and a high quantum efficiency. This layer 22 absorbs all photons having wavelengths between the absorption limit wavelength of the window layer and its own absorption limit wavelength. Photons absorbed in layer 22 generate electron-hole pairs. The photogenerated electrons diffuse into the third layer or storage layer 21.

Now, it is known from the book entitled *Heterostructure Lasers* by H. C. Casey and H. B. Panish, Academic Press, New York, 1978, that the forbidden energy band $E_G$ of such a compound is a function of the concentrations x and y:

$$E_G = f(x,y).$$

On the other hand the crystal lattice parameter a is a different function of these concentrations:

$$a = g(x,y).$$

The elements C and D are chosen so as to form with A and B a compound having a small demixing zone and a direct forbidden band transition. The crystal lattice parameter a of this compound is then chosen so that it is adapted to the crystal lattice parameter of the binary compound AB. Its forbidden energy band, $E_G$, is chosen so as to be small corresponding to a large absorption limit wavelength $\lambda_1$.

The two aforementioned equations may be used to determine, starting from the values of a and $E_G$ chosen independently of each other, the values of the concentrations x and y (i.e. the composition of the quaternary material $C_xA_{1-x}D_yB_{1-y}$), while ensuring that the compound is not in the demixing range of the solid solution.

It should be noted on the one hand that the forbidden energy band $E_G$ is a function of the absorption limit wavelength $\lambda$ according to the formula $$E_G = h.c/\lambda.$$

where
$h = 6.6252 \cdot 10^{-34}$ J.S., and
$c = 2.9979 \cdot 10^8$ m.S$^{-1}$.
By choosing a value of $E_G$, one can select the range of sensitivity of a CCD to given elements A, B, C and D.

It should be noted on the other hand that the compound $C_xA_{1-x}D_yB_{1-y}$ is actually a pseudobinary compound, due to the fact that the atoms of the elements C and D will occupy sites of the atoms A and B, respectively. Under these conditions, CCD's can be designed which have different sensitivity ranges and especially larger absorption limit wavelengths $\lambda_1$ by introducing supplementary elements of groups III and V into the compound constituting the sensitive layer 22. As a result, an n-ary compound is formed having the formula $$(A,X,Y, \ldots)_{III}(B,M,N, \ldots)_V$$

while the correspondence in lattice between this novel compound and the binary compound AB is maintained.

The third layer of the CCD is the storage layer 21. It has a binary structure AB. The storage layer is of n-type conductivity and has a forbidden energy band which is as large as possible. The large energy band is provided to obtain a device having a low dark current, a low leakage current, and a low channel current. It has to exhibit, moreover, a high electronic mobility because this property influences the transfer efficiency of the device. Finally, the storage layer 21 supports control electrodes 1 and output electrode 2. Electrodes 1 receive one or more clock signals $H_1, H_2, \ldots H_n$. Output electrode or electrodes 2 receive the output signal or signals O.

Thus, exposure of the window layer 23 through the rear surface of the transparent supporting plate 20 to radiation having a wavelength between $\lambda_0$ and $\lambda_1$ causes photon injection into absorbing layer 22. The photons produce electron-hole pairs in the absorbing layer 22 in a quantity proportional to the absorbed luminous energy. The n-type storage layer 21 is provided with a regular network of control electrodes 1 disposed on layer 21 in the form of a matrix. The application of a voltage to these electrodes leads to the formation under these electrodes of depopulated potential wells. The generated photoelectrons are collected in the potential wells. Thereafter, they are transferred by a shift register to an output device, generally comprising a reading amplifier.

Figure 2A:
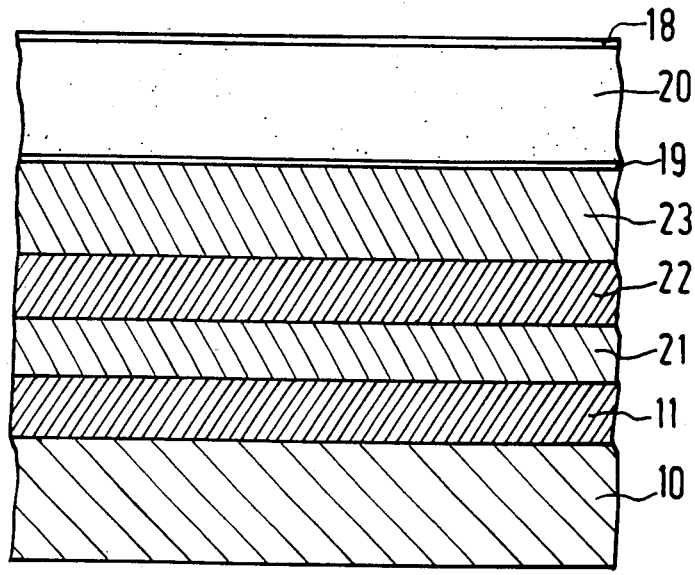
FIGS. 2a and 2b are partly schematic, partly sectional views of the different stages of the manufacture of a CCD according to the invention.
Figure 2B:
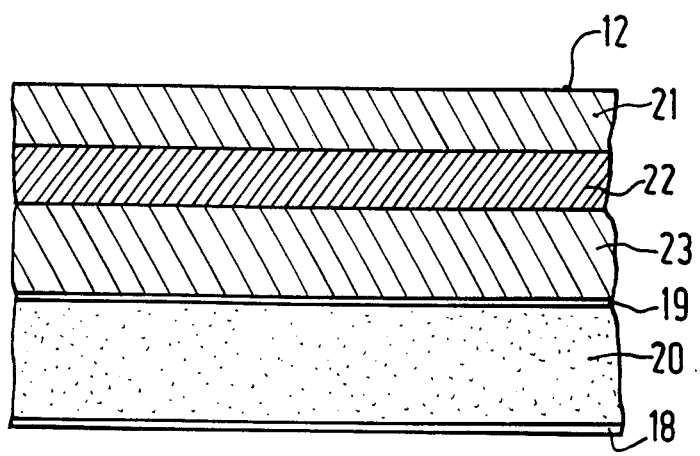

FIGS. 2a and 2b illustrate the different stages of manufacturing a CCD according to the invention. A block of the binary compound AB provides a substrate 10. The crystal lattice parameter of substrate 10 determines the crystal lattice parameters of all the epitaxial layers subsequently formed.

An epitaxial layer 11 of the n-ary material chosen (i.e. the chemical blocking layer) is formed on substrate 10. The function of layer 11 is to form a support having the crystal lattice parameter required for the subsequent growth of the binary layer 21 of the composition AB. At the same time, layer 11 permits the chemical dissolution of the substrate 10 without itself being attacked. After substrate 10 is dissolved, layer 11 can be dissolved chemically without affecting next layer 21.

Consequently, there are successively formed on the layer 11 by epitaxial growth the binary layer 21 of the n-doped material AB, the layer 22 of the p-doped n-ary material, and the binary layer 23 of the material AB.

In order to improve optical transmission, a series of antireflection layers 19 can be formed at the surface of the layer 23. The function of such a series of layers is to block radiation having wavelengths smaller than $\lambda_0$ and larger than $\lambda_1$, and to pass radiation of wavelengths between $\lambda_0$ and $\lambda_1$ with the largest possible transmission.

For this purpose, the series is composed of a largest possible odd number (at least nine) of layers having a thickness $\lambda/4$ for the average wavelength $\lambda$ in the interval $\lambda_0$ to $\lambda_1$. These layers are formed from a material transparent in the wavelength range $\lambda_0, \lambda_1$. The layers alternately have a high and a low refractive index, and start and end with layer of a high index. The first and last layers are also adapted to the environments with which they are in contact (air or semi-insulating material), and can, for this reason, have thicknesses slightly different from $\lambda/4$, or even thicknesses which are greatly different and may be up to $\lambda/2$.

The assembly formed by the substrate 10 and the layers 11, 21, 22, 23, and 19 is then fused to the supporting plate 20. Depending upon the application, plate 20 may be glass or a polymerizable resin. Subsequently, the substrate 10 and the blocking chemical layer 11 are successively removed by selective chemical attacks without attacking the three layers 21, 22 and 23 constituting the CCD. The resulting structure is shown in FIG. 2b. Thus, the surface 12 of the storage layer 21, on which the electrodes of the device are formed, is exposed.

At this stage, a series of antireflection layers 18, made according to the same principles as the series of layers 19, can be provided on the outer surface of supporting plate 20.

The control electrodes 1 on binary layers AB, such as the layer 21 described, may form Schottky barriers with the layer or may be of the MIS type.

The formation of Schottky barriers has the advantage of being "anti-blooming" type. That is, such a structure improves the optical definition of the device in operation. On the other hand, MIS (metal - insulator - semiconductor) contacts are technologically much more easily formed.

Finally, there is formed on the surface 12 of the layer 21 the output electrode 2. Electrode 2 and layer 21 are in ohmic contact.

The control electrodes 1 are disposed at the surface of the layer 21 in the form of a matrix. In the matrix, a given number of lines are grouped. Each group is terminated with an output O designated by reference numeral 2. Each of these lines must be insulated from the other lines.

According to the invention, the lines are insulated preferably by proton bombardment in layer 21. Alternatively, the lines may be insulated as described in the Liu et al article, by a guard ring in the form of an ohmic contact or by etching the layer 21. However, a binary layer, such as chosen for forming the CCD according to the invention, permits using a proton bombardment which provides the simplest form of insulation.

In the method of manufacturing the CCD according to the invention, the thickness of the sensitive layer 22 is a function of the diffusion length of the n-ary material. The thickness of the storage layer 21 is a function of the thickness of the channel desired for the value of the polarization used.

In a preferred example of this method, a CCD can be obtained which is particularly suitably adapted to operation in the range of wavelengths between 0.9 and 1.7 $\mu$m. Such a CCD is consequently particularly suitable for detecting infrared radiation.

For this purpose, an ingot of indium phosphide (InP) provides the binary starting substrate 10. A layer 11 of the quaternary semiconductor $Ga_xIn_{1-x}As_yP_{1-y}$, a layer 21 of n-doped InP, a layer 22 of p-doped $Ga_xIn_{1-x}As_yP_{1-y}$, and finally a layer 23 of InP are successively epitaxially grown on substrate 10.

The binary compound InP has a crystal lattice parameter $a_o \approx 0.587$ nm and a forbidden band energy $E_{GO}$ 1.35 eV at a temperature of 300° K. The energy band corresponds to an absorption wavelength $\lambda_0 \approx 0.9$ $\mu$m.

The book entitled *Heterostructure Lasers* mentioned above also discloses at page 38 that the compound $Ga_xIn_{1-x}As_yP_{1-y}$ has a forbidden band energy $E_{G1}$ varying from 0.74 to 1.35 eV (the absorption limit wavelength $\lambda_1$ then varying from 1.7 to 0.9 $\mu$m) at 300° K. According to FIG. 5.5.6 of this document (page 40), the $Ga_xIn_{1-x}As_yP_{1-y}$ lattice can be made to correspond to the InP lattice for $E_G \approx 0.74$ eV ($\lambda_1 \approx 1.7$ $\mu$m) if $x \approx 0.47$. The value of $E_G$ is given by the relation $E_G = 1.35 - 1.3 x$.

The concentration y is related to the concentration x in this compound by the formula $y \approx 2.3 x$. This is described in an article by M. Quillec et al. entitled "High mobility in liquid phase epitaxial InGaAsP free of composition modulations", *Applied Physics Letters*, Vol. 42, No. 10, pages 886-887, May 15, 1983. The correspondence in lattice is obtained between the two layers if $y<0.1$.

In this preferred example of the invention, the layer thicknesses are $e_1 = 0.3$ to 2 μm for the storage layer 21, $e_2 = 2$ to 10 μm for the sensitive layer 22, and $e_3 = 5$ to 10 μm for the window layer 23.

The substrate 10 can be removed by an etchant mixture formed from one part of hydrophosphoric acid (80% concentration) and one part of hydrochloric acid (50% concentration). The mixture is brought to 50° C. Layer 11 can be removed by an etchant mixture formed from one part of hydrofluoric acid (50% concentration), one part of nitric acid (30% concentration), and one part of water.

The ohmic contacts constituting the output 2 are formed first on the surface 12 of the layer 21. Openings provided in a photosensitive lacquer (photoresist) define the positions of these contacts. In these openings, for example, a gold-germanium eutectic (Ge-Au in the ratio 88/12) is deposited. The deposition is brought to 450° C. to form the alloy. A nickel (Ni) layer is then deposited on the surface of the contacts.

The first layer of photosensitive lacquer constituting the first mask is removed, and a second analogous mask is deposited on the surface 12. The second mask defines the positions of the control electrodes.

By using the method according to the invention, two types of control electrodes can consequently be utilized, depending upon the purpose envisaged.

Schottky barrier electrodes can be formed by successively depositing in the openings of the second mask a layer of titanium (Ti) having a thickness of about 100 nm, a layer of aluminum (Al) having a thickness of about 500 nm and a layer of platinum (Pt) to avoid oxidation of the aluminum.

In a variation of this method, MIS contacts can be formed by successively depositing in the openings of the second mask a layer of insulating material, such as silicon dioxide ($SiO_2$), a layer of aluminum (Al) and a layer of platinum (Pt).

The second mask is then also removed. Subsequently, the rows of control electrodes are insulted, preferably by proton bombardment.

The antireflection layers which may be formed during such a method, will be formed from silicon nitride ($Si_3N_4$) and silicon dioxide ($SiO_2$). Silicon nitride forms the high refractive index layers. The index of this silicon nitride is $n_1 \approx 2$. Silicon dioxide forms the low refractive index layers. The index of silicon dioxide is $n_2 \approx 1.5$.

With 13 of these alternating layers having thicknesses of about $\lambda/4$, a transmission of 99.99% can be obtained with $\lambda \approx 1.1$ μm in the range of wavelengths between $\lambda_0 = 0.9$ μm and $\lambda_1 = 1.7$ μm.

The preferred operating temperature of the device obtained by the latter method is on the order of 77° K. However, a temperature of 210° K. obtained by cooling by "Peltier" elements is acceptable for obtaining sufficient contrast. Such a cooling system permits one to obtain a simple and readily transportable imaging device.

In general, the CCD's obtained according to the invention, which have a binary storage layer, exhibit synergy in manufacture with ultrahigh speed or superhigh frequency integrated circuits.

However, it is remarkable that in the very case in which the CCD is formed from the binary compound InP it is not only possible to obtain high performance circuits monolithically integrated with the CCD, but the latter also has a sensitivity range which is particularly suitably adapted to the manufacture of infrared imaging devices.

Moreover, all the advantages offered by the method, which make it possible to obtain such a CCD, have to be taken into account.

Firstly, the starting block of InP can be obtained in large diameter and of high crystalline quality. These provide substrates for growing suitable epitaxial layers. Subsequently, the quaternary layer (Ga,In)(AsP) exhibits a small demixing zone and can be readily obtained. Finally, the electrodes can be of the MIS type or of the Schottky barrier type, and these electrodes can be insulated by a simple method.

It is clear that numerous variations of this device and different applications of this method are possible without departing from the scope of the invention as defined in the appended claims.

I claim:

1. A method of manufacturing a charge coupled device, said method comprising the steps of:

forming a monocrystalline substrate of a binary semiconductor compound AB, A being an element from Group III of the Periodic Table, B being an element from Group V of the Periodic Table, said substrate having crystal lattice parameters;

epitaxially growing on the substrate a chemical blocking layer having the formula $(A,X,Y \ldots)_{III}(B,M,N \ldots)_V$, $A,X,Y \ldots$ being elements from Group III of the Periodic Table, $B,M,N \ldots$ being elements from Group V of the Periodic Table, said chemical blocking layer having crystal lattice parameters which are close to the crystal lattice parameters of the substrate;

epitaxially growing on the chemical blocking layer a storage layer formed of a binary compound AB, A being an element from Group III of the Periodic Table, B being an element from Group V of the Periodic Table, said storage layer having crystal lattice parameters which are close to the crystal lattice parameters of the chemical blocking layer;

epitaxially growing on the storage layer an absorbing layer, said absorbing layer formed of a compound with n elements and having the formula $(A,X,Y \ldots)_{III}(B,M,N \ldots)_V$, $A,X,Y \ldots$ being elements from group III of the Periodic Table, $B,M,N \ldots$ being elements from Group V of the Periodic Table, said absorbing layer having crystal lattice parameters which are close to the crystal lattice parameters of the storage layer;

epitaxially growing on the absorbing layer a window layer, said window layer being formed of a binary compound AB, A being an element from Group III of the Periodic Table, B being an element from Group V of the Periodic Table, said window layer having crystal lattice parameters which are close to the crystal lattice parameters of the absorbing layer;

fusing the window layer to a supporting plate;

removing the substrate by selective attack with a chemical;

removing the chemical blocking layer by selective attack with a chemical; and forming output and control electrodes on the storage layer.

2. A method of manufacturing a charge coupled device, said method comprising the steps of:

forming a monocrystalline substrate of a binary semiconductor compound AB, A being an element from Group III of the Periodic Table, B being an element from Group V of the Periodic Table, said substrate having crystal lattice parameters;

epitaxially growing on the substrate a chemical blocking layer having the formula $C_xA_{1-x}D_yB_{1-y}$, where A and C are elements from Group III of the Periodic Table and B and D are elements from Group V of the Periodic Table, said chemical blocking layer having crystal lattice parameters which are close to the crystal lattice parameters of the substrate;

epitaxially growing on the chemical blocking layer a storage layer formed of a binary compound AB, A being an element from Group III of the Periodic Table, B being an element from Group V of the Periodic Table, said storage layer having crystal lattice parameters which are close to the crystal lattice parameters of the chemical blocking layer;

epitaxially growing on the storage layer an absorbing layer having the formula $C_xA_{1-x}D_yB_{1-y}$, where A and C are elements from Group III of the Periodic Table, and B and D are elements from Group V of the Periodic Table, said absorbing layer having crystal lattice parameters which are close tö the crystal lattice parameters of the storage layer;

epitaxially growing on the absorbing layer a window layer, said window layer being formed of a binary compound AB, A being an element from Group III of the Periodic Table, B being an element from Group V of the Periodic Table, said window layer having crystal lattice parameters which are close to the crystal lattice parameters of the absorbing layer;

fusing the window layer to a supporting plate;

removing the substrate by selective attack with a chemical;

removing the chemical blocking layer by selective attack with a chemical; and forming output and control electrodes on the storage layer.

3. A method as claimed in claim 2, characterized in that:

AB is InP; and $C_xA_{1-x}D_yB_{1-y}$ is $Ga_xIn_{1-x}As_yP_{1-y}$, where x is approximately equal to 0.47 and y is less than 0.1.

4. A method as claimed in claim 3, characterized in that:

the chemical for removing the substrate is a mixture of one part hydrophosphoric acid of 80% concentration by volume, and one part hydrochloric acid of 40% concentration by volume at 50° C.; and the chemical for removing the chemical blocking layer is a mixture of one part hydrofluoric acid of 50% concentration by volume, one part nitric acid of 30% concentration by volume, and one part water at ambient temperature.

5. A method as claimed in claim 4, characterized in the the control electrodes are formed by the steps of:

forming a mask with openings on the storage layer;

depositing a layer of insulating material on the storage layer through the openings in the mask; and depositing a metallic layer on the insulating layer through the openings in the mask.

6. A method as claimed in claim 4, characterized in that the control electrodes are formed by the steps of:

forming a mask with openings on the storage layer;

depositing a layer of titanium on the storage layer through the openings in the mask;

depositing a layer of aluminum on the titanium layer through the openings in the mask; and depositing a layer of platinum on the aluminum layer through the openings in the mask.

7. A method as claimed in claim 4, further comprising the step of bombarding the storage layer with protons to form insulating regions between the control electrodes.

8. A method as claimed in claim 4, further comprising the step of forming antireflection layers on both sides of the supporting plate, the layers not reflecting wavelengths from $\lambda_0$ to $\lambda_1$.

9. A method as claimed in claim 8, characterized in that the antireflection layers are formed by depositing an odd number of layers of material transparent to radiation in the wavelength range $\lambda_0$ to $\lambda_1$, said layers having alternating high and low refractive indices.

10. A method as claimed in claim 9, characterized in that:

the high index layers are silicon nitride; and the low index layers are silicon dioxide.

11. A method as claimed in claim 4, characterized in that the supporting plate is glass.

12. A method as claimed in claim 4, characterized in that the supporting plate is a polymerizable resin.

13. A method of manufacturing a charge coupled device, said method comprising the steps of:

forming a monocrystalline substrate of a binary semiconductor compound AB, A being an element from Group III of the Periodic Table, B being an element from Group V of the Periodic Table, said substrate having crystal lattice parameters;

epitaxially growing on the substrate a chemical blocking layer having the formula AB, where A is one or more elements from Group III of the Periodic Table, and B is one or more elements from Group V of the Periodic Table, said chemical blocking layer having crystal lattice parameters which are close to the crystal lattice parameters of the substrate;

epitaxially growing on the chemical blocking layer a storage layer formed of a binary compound AB, A being an element from Group III of the Periodic Table, B being an element from Group V of the Periodic Table, said storage layer having crystal lattice parameters which are close to the crystal lattice parameters of the chemical blocking layer;

epitaxially growing on the storage layer an absorbing layer, said absorbing layer formed of a compound with n elements and having the formula AB, where A is one or more elements from Group III of the Periodic Table, and B is one or more elements from Group V of the Periodic Table, said absorbing layer having crystal lattice parameters which are close to the crystal lattice parameters of the storage layer;

epitaxially growing on the absorbing layer a window layer, said window layer being formed of a binary compound AB, A being an element from Group III of the Periodic Table, B being an element from Group V of the Periodic Table, said window layer having crystal lattice parameters which are close to the crystal lattice parameters of the absorbing layer;

fusing the window layer to a supporting plate;

removing the substrate by selective attack with a chemical;

removing the chemical blocking layer by selective attack with a chemical; and forming output and control electrodes on the storage layer.

* * * * *